United States Patent
Funakoshi et al.

(10) Patent No.: US 12,376,426 B2
(45) Date of Patent: Jul. 29, 2025

(54) NITRIDE SEMICONDUCTOR LIGHT-EMITTING ELEMENT

(71) Applicant: NICHIA CORPORATION, Anan (JP)

(72) Inventors: Ryota Funakoshi, Tokushima (JP); Makoto Abe, Tokushima (JP)

(73) Assignee: NICHIA CORPORATION, Anan (JP)

(*) Notice: Subject to any disclaimer, the term of this patent is extended or adjusted under 35 U.S.C. 154(b) by 465 days.

(21) Appl. No.: 18/060,102

(22) Filed: Nov. 30, 2022

(65) Prior Publication Data

US 2023/0197890 A1    Jun. 22, 2023

(30) Foreign Application Priority Data

Dec. 17, 2021   (JP) .................... 2021-204796

(51) Int. Cl.
| | |
|---|---|
| H01L 33/00 | (2010.01) |
| H10H 20/01 | (2025.01) |
| H10H 20/812 | (2025.01) |
| H10H 20/825 | (2025.01) |

(52) U.S. Cl.
CPC .... *H10H 20/812* (2025.01); *H10H 20/01335* (2025.01); *H10H 20/825* (2025.01)

(58) Field of Classification Search
None
See application file for complete search history.

(56) References Cited

U.S. PATENT DOCUMENTS

| | | | |
|---|---|---|---|
| 2004/0066816 A1 | 4/2004 | Collins et al. | |
| 2010/0207100 A1* | 8/2010 | Strassburg | H10H 20/825 257/15 |
| 2010/0224860 A1* | 9/2010 | Ibbetson | H10H 20/811 257/E29.089 |
| 2011/0095331 A1 | 4/2011 | Hanawa et al. | |
| 2013/0069032 A1* | 3/2013 | Kushibe | H10H 20/825 438/47 |
| 2017/0294554 A1 | 10/2017 | Tani et al. | |
| 2018/0062041 A1 | 3/2018 | Nakanishi | |

(Continued)

FOREIGN PATENT DOCUMENTS

| | | |
|---|---|---|
| JP | 2004-128502 A | 4/2004 |
| JP | 2015-018923 A | 1/2015 |

(Continued)

*Primary Examiner* — Bradley Smith
(74) *Attorney, Agent, or Firm* — Foley & Lardner LLP

(57) ABSTRACT

A nitride semiconductor light-emitting element includes a first n-side semiconductor layer, a first active layer located on the first n-side semiconductor layer, a first p-side semiconductor layer located on the first active layer, a second n-side semiconductor layer located on the first p-side semiconductor layer, a second active layer located on the second n-side semiconductor layer, and a second p-side semiconductor layer located on the second active layer. The second n-side semiconductor layer has a tunnel junction with the first p-side semiconductor layer. The first active layer includes a first well layer and a first barrier layer alternately arranged in a stacking direction. The second active layer includes a second well layer and a second barrier layer alternately arranged in the stacking direction. The second well layer is thinner than the first well layer. The second barrier layer is thicker than the first barrier layer.

19 Claims, 9 Drawing Sheets

(56) References Cited

U.S. PATENT DOCUMENTS

| | | |
|---|---|---|
| 2020/0035860 A1 | 1/2020 | Michiue |
| 2020/0152691 A1 | 5/2020 | Lee |
| 2021/0020686 A1 | 1/2021 | Kishino |
| 2021/0202790 A1* | 7/2021 | Hayashi ............ H10H 20/0137 |
| 2021/0328095 A1 | 10/2021 | Hayashi |

FOREIGN PATENT DOCUMENTS

| | | |
|---|---|---|
| JP | 2016-225568 A | 12/2016 |
| JP | 2018-107420 A | 7/2018 |
| JP | 2021-019075 A | 2/2021 |
| JP | 2021-106245 A | 7/2021 |
| JP | 2021-174813 A | 11/2021 |
| WO | WO-2009/154129 A1 | 12/2009 |
| WO | WO-2016/047386 A1 | 3/2016 |
| WO | WO-2018/062252 A1 | 4/2018 |

* cited by examiner

NITRIDE SEMICONDUCTOR LIGHT-EMITTING ELEMENT

CROSS-REFERENCE TO RELATED APPLICATIONS

This application is based upon and claims the benefit of priority from the prior Japanese Patent Application No. 2021-204796, filed on Dec. 17, 2021, the entire contents of which are incorporated herein by reference.

FIELD

Embodiments relate to a nitride semiconductor light-emitting element.

BACKGROUND

For example, JP-A 2004-128502 describes a light-emitting element including a first light-emitting part that includes a first n-type layer, a first active layer, and a first p-type layer, a tunnel junction layer located on the first light-emitting part, and a second light-emitting part that is located on the tunnel junction layer and includes a second n-type layer, a second active layer, and a second p-type layer.

SUMMARY

According to one aspect of the present invention, a nitride semiconductor light-emitting element includes a first n-side semiconductor layer, a first active layer located on the first n-side semiconductor layer, a first p-side semiconductor layer located on the first active layer, a second n-side semiconductor layer located on the first p-side semiconductor layer, a second active layer located on the second n-side semiconductor layer, and a second p-side semiconductor layer located on the second active layer. The second n-side semiconductor layer has a tunnel junction with the first p-side semiconductor layer. The first active layer includes a first well layer and a first barrier layer alternately arranged in a stacking direction. The stacking direction is from the first n-side semiconductor layer toward the first p-side semiconductor layer. The second active layer includes a second well layer and a second barrier layer alternately arranged in the stacking direction. A thickness of the second well layer is less than a thickness of the first well layer. A thickness of the second barrier layer is greater than a thickness of the first barrier layer.

DETAILED DESCRIPTION

Figure 1:
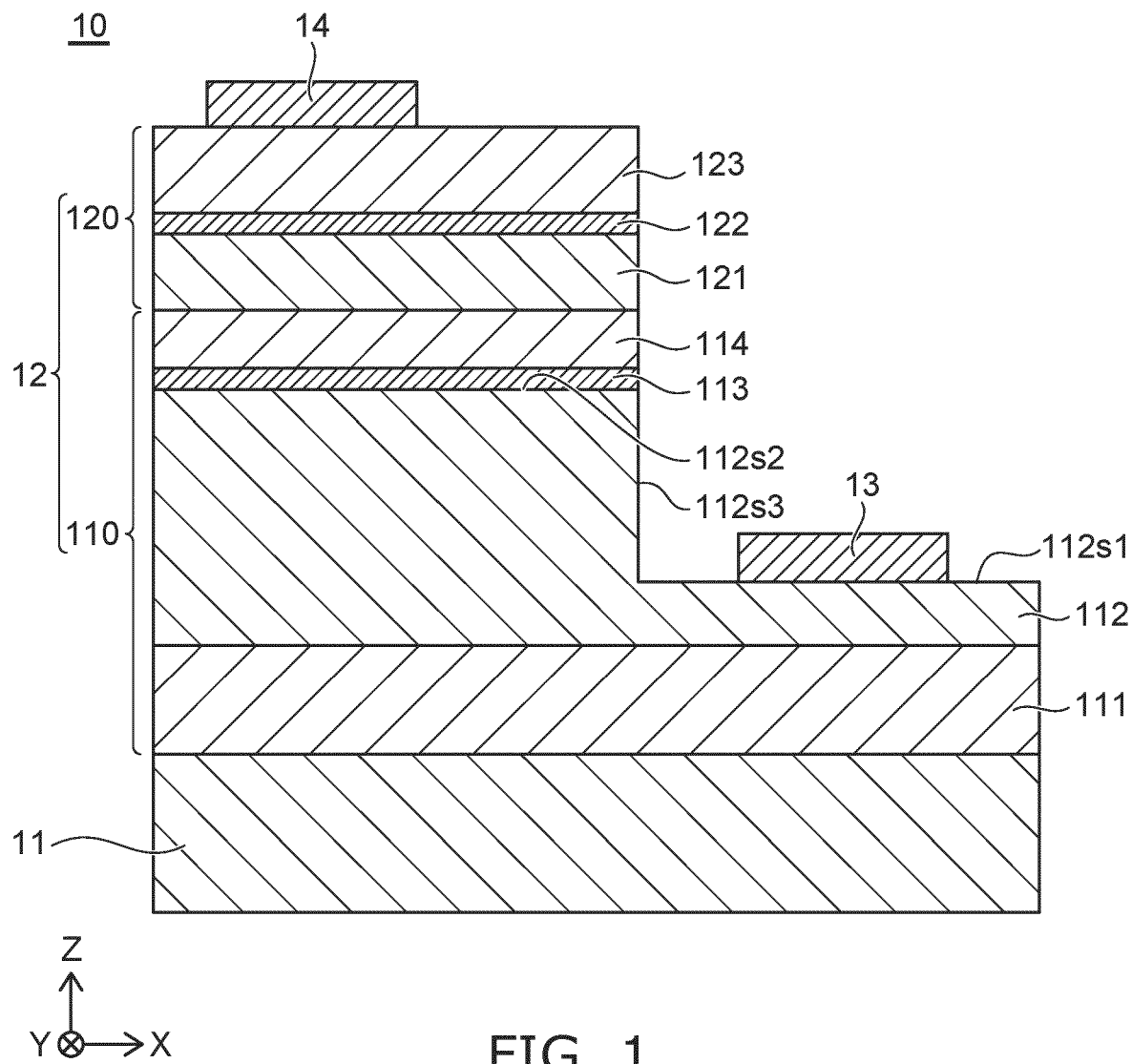
FIG. 1 is a cross-sectional view showing a nitride semiconductor light-emitting element according to a first embodiment.

Exemplary embodiments will now be described with reference to the drawings. The drawings are schematic or conceptual, and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. In the specification of the application and the drawings, components similar to those described in regard to a drawing therein above are marked with like reference numerals, and a detailed description is omitted as appropriate.

For easier understanding of the following description, the arrangements and configurations of the portions are described using an XYZ orthogonal coordinate system. The X-axis, the Y-axis, and the Z-axis are orthogonal to each other. The direction in which the X-axis extends is taken as an "X-direction," the direction in which the Y-axis extends is taken as a "Y-direction," and the direction in which the Z-axis extends is taken as a "Z-direction." Although up is taken as the Z-direction and down is taken as the opposite direction for easier understanding of the description, these directions are relative and are independent of the direction of gravity.

First Embodiment

First, a first embodiment will be described.

FIG. 1 is a cross-sectional view showing a nitride semiconductor light-emitting element 10 according to the embodiment.

Figure 2A:
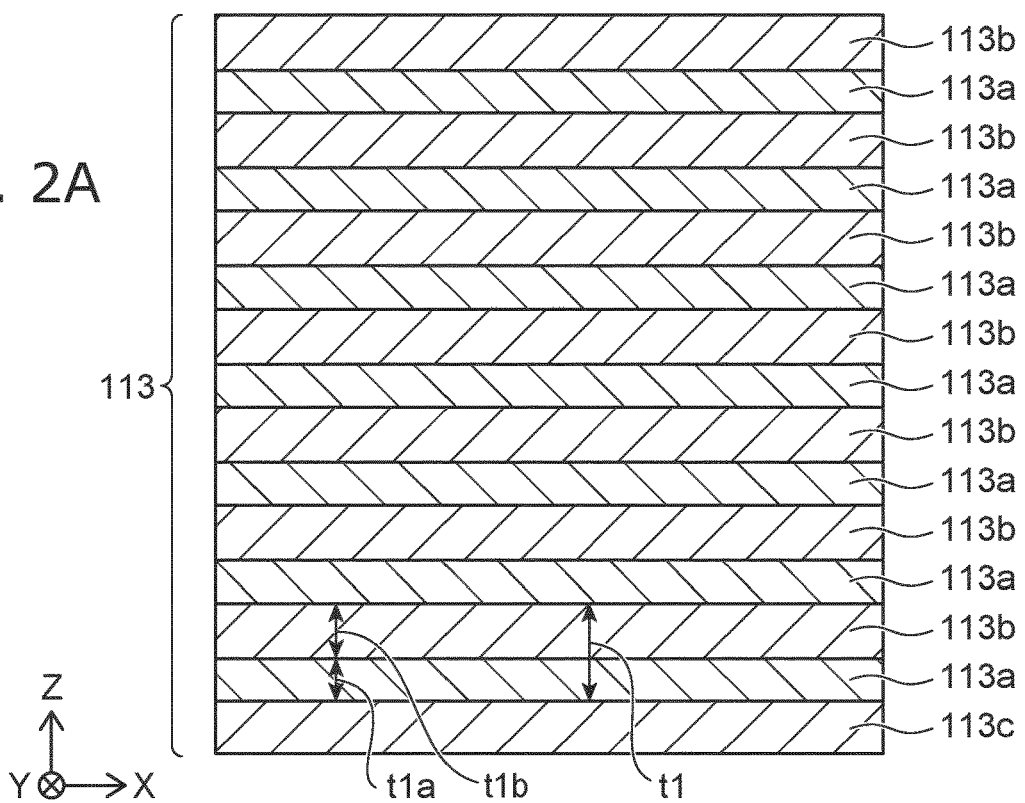
FIG. 2A is an enlarged cross-sectional view showing a first active layer of FIG. 1.

FIG. 2A is an enlarged cross-sectional view showing a first active layer 113 of FIG. 1.

Figure 2B:
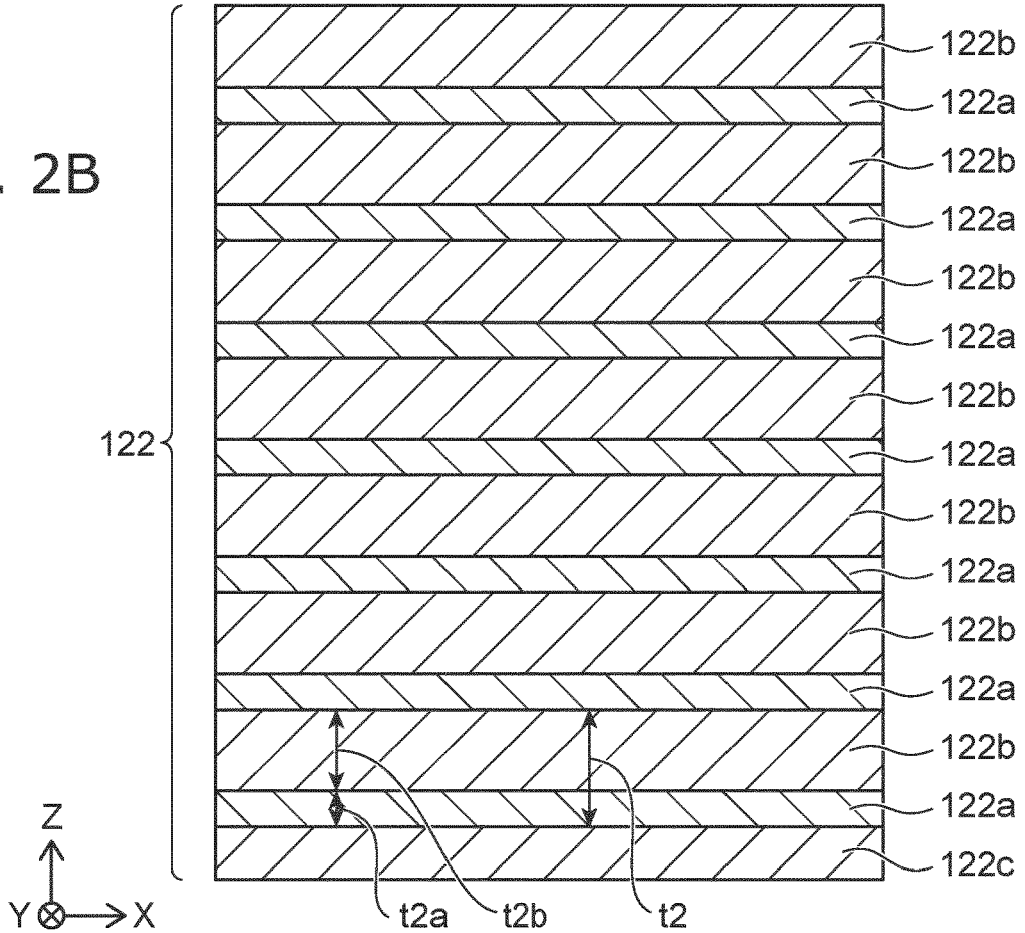
FIG. 2B is an enlarged cross-sectional view showing a second active layer of FIG. 1.

FIG. 2B is an enlarged cross-sectional view showing a second active layer 122 of FIG. 1.

Figure 3:
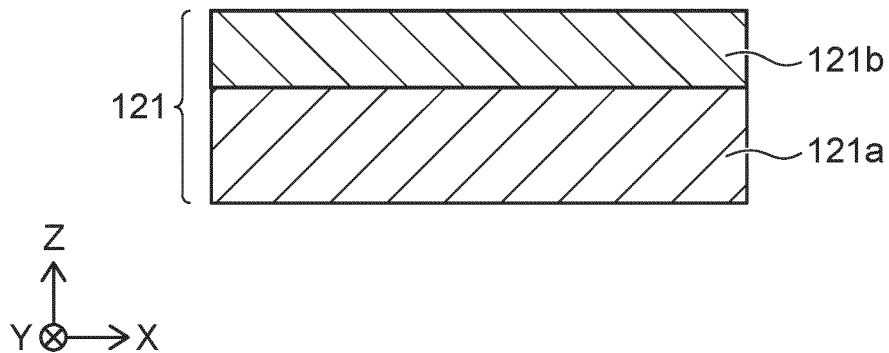
FIG. 3 is an enlarged cross-sectional view showing a second n-side semiconductor layer of FIG. 1.

FIG. 3 is an enlarged cross-sectional view showing a second n-side semiconductor layer 121 of FIG. 1.

As shown in FIG. 1, the nitride semiconductor light-emitting element 10 includes a substrate 11, a semiconductor structure body 12, an n-side electrode 13, and a p-side electrode 14. Hereinbelow, the nitride semiconductor light-emitting element 10 also is called simply the "light-emitting element 10."

The substrate 11 has a flat plate shape. For example, the upper surface and the lower surface of the substrate 11 are substantially parallel to the X-Y plane. For example, the substrate 11 is made of sapphire ($Al_2O_3$). However, the substrate 11 may include another material such as silicon (Si), silicon carbide (SiC), gallium nitride (GaN), etc. The semiconductor structure body 12 is located on the substrate 11.

The semiconductor structure body 12 is, for example, a stacked body in which multiple semiconductor layers made of nitride semiconductors are stacked. In this specification, "nitride semiconductor" is a semiconductor that includes nitrogen, and typically includes all compositions of semiconductors of the chemical formula $In_xAl_yGa_{1-x-y}N$ (0≤x≤1, 0≤y≤1, and x+y≤1) for which the composition ratios x and y are changed within the ranges respectively. Thus, in this specification, "nitride semiconductor light-emitting element" means a light-emitting element in which the semiconductor layers included in the light-emitting element are made of nitride semiconductors.

The semiconductor structure body 12 includes a first light-emitting part 110 and a second light-emitting part 120 in this order upward from a lower side. The first light-emitting part 110 includes a first n-side semiconductor layer 112, the first active layer 113, and a first p-side semiconductor layer 114 in this order upward from a lower side. The first light-emitting part 110 further includes a foundation layer 111 located under the first n-side semiconductor layer 112. The second light-emitting part 120 includes the second n-side semiconductor layer 121, the second active layer 122, and a second p-side semiconductor layer 123 in this order upward from a lower side. The components of the semiconductor structure body 12 will now be elaborated.

The foundation layer 111 of the first light-emitting part 110 is located on the substrate 11. The foundation layer 111 includes, for example, an undoped semiconductor layer. In the specification, "undoped" means that neither an n-type impurity nor a p-type impurity is intentionally doped. In other words, an undoped semiconductor layer is a semiconductor layer formed without supplying a raw material gas including an n-type impurity and/or a p-type impurity. The term "n-type impurity" means an impurity that forms donors. The term "p-type impurity" means an impurity that forms acceptors. There are cases in which an undoped semiconductor layer that is adjacent to a layer intentionally doped with an n-type impurity and/or a p-type impurity includes the n-type impurity and/or the p-type impurity due to diffusion into the undoped semiconductor layer from the adjacent layer, etc.

The undoped semiconductor layer of the foundation layer 111 includes, for example, GaN. The first n-side semiconductor layer 112 is located on the foundation layer 111. However, the first n-side semiconductor layer may be directly located on the substrate without including the foundation layer in the first light-emitting part.

The first n-side semiconductor layer 112 includes one or more n-type semiconductor layers. The n-type semiconductor layer of the first n-side semiconductor layer 112 includes, for example, GaN doped with silicon (Si) as the n-type impurity. The n-type semiconductor layer of the first n-side semiconductor layer 112 may further include indium (In), aluminum (Al), etc. The n-type semiconductor layer of the first n-side semiconductor layer 112 may include germanium (Ge) as the n-type impurity.

It is sufficient for the first n-side semiconductor layer 112 to have a function of supplying electrons, and the first n-side semiconductor layer 112 may further include one or more undoped semiconductor layers. The undoped semiconductor layer of the first n-side semiconductor layer 112 includes, for example, GaN.

The first n-side semiconductor layer 112 includes a first surface 112s1, a second surface 112s2, and a third surface 112s3. The first surface 112s1 is substantially parallel to the X-Y plane. The second surface 112s2 is positioned higher than the first surface 112s1 and is substantially parallel to the X-Y plane. When viewed in top-view, the second surface 112s2 is next to the first surface 112s1 in the X-direction. The third surface 112s3 is positioned between the first surface 112s1 and the second surface 112s2 and is substantially parallel to the Y-Z plane. The first active layer 113 is located on the second surface 112s2.

As shown in FIG. 2A, the first active layer 113 includes a first well layer 113a and a first barrier layer 113b alternately arranged in the stacking direction, i.e., the Z-direction, from the first n-side semiconductor layer 112 toward the first p-side semiconductor layer 114. According to the embodiment, the first active layer 113 includes seven first well layers 113a and seven first barrier layers 113b. However, the quantity of the first well layers and the quantity of the first barrier layers are not limited to such numbers. The first active layer 113 further includes a third barrier layer 113c between the first n-side semiconductor layer 112 and the lowermost first well layer 113a among the multiple first well layers 113a. Thus, the first active layer 113 of the embodiment has a multi-quantum well structure including the multiple first well layers 113a.

Each first well layer 113a is, for example, an undoped semiconductor layer including indium gallium nitride (InGaN). However, at least a portion of the first well layer may include an n-type impurity and/or a p-type impurity. The first well layer 113a may further include Al. The first well layer 113a may be, for example, aluminum gallium nitride (AlGaN).

Each first barrier layer 113b is, for example, an undoped semiconductor layer including GaN. However, at least a portion of the first barrier layer may include an n-type impurity and/or a p-type impurity. The first barrier layer 113b may further include Al.

A thickness t1a of the first well layer 113a and a thickness t1b of the first barrier layer 113b are described below.

The third barrier layer 113c has, for example, a stacked structure of an undoped semiconductor layer and a semiconductor layer including an n-type impurity. The undoped semiconductor layer of the third barrier layer 113c includes, for example, GaN. The semiconductor layer of the third barrier layer 113c that includes the n-type impurity includes, for example, InGaN doped with Si as the n-type impurity. The third barrier layer 113c has the function of supplying electrons to the first active layer 113.

As shown in FIG. 1, the first p-side semiconductor layer 114 is located on the first active layer 113, that is, on the uppermost first barrier layer 113b.

As shown in FIG. 1, the first p-side semiconductor layer 114 includes, for example, one or more p-type semiconductor layers having a function of supplying holes to the first active layer 113. The p-type semiconductor layer of the first p-side semiconductor layer 114 includes, for example, GaN doped with magnesium (Mg) as the p-type impurity. The p-type semiconductor layer of the first p-side semiconductor layer 114 may further include Al.

The first p-side semiconductor layer 114 may further include one or more undoped semiconductor layers. The undoped semiconductor layer of the first p-side semiconductor layer 114 includes, for example, GaN. The undoped semiconductor layer of the first p-side semiconductor layer 114 may further include Al. The first p-side semiconductor layer may further include a p-type upper semiconductor layer that has a tunnel junction with the second n-side semiconductor layer 121. The upper semiconductor layer includes, for example, GaN doped with Mg as the p-type impurity. For example, the p-type impurity concentration of the upper semiconductor layer is greater than the p-type impurity concentration of the p-type semiconductor layer positioned below the upper semiconductor layer in the first p-side semiconductor layer 114. The second n-side semiconductor layer 121 is located on the first p-side semiconductor layer 114.

According to the embodiment as shown in FIG. 3, the second n-side semiconductor layer 121 includes a first n-type layer 121a that has a tunnel junction with the first p-side semiconductor layer 114, and a second n-type layer 121b located on the first n-type layer 121a.

The first n-type layer 121a includes an n-type impurity and has a higher n-type impurity concentration than the first n-side semiconductor layer 112 and the second n-type layer 121b. The first n-type layer 121a includes, for example, GaN doped with Si as the n-type impurity. The first n-type layer 121a may include InGaN doped with Si as the n-type impurity. The n-type impurity concentration of the first n-type layer 121a is, for example, not less than $1\times10^{20}$ cm$^{-3}$ and not more than $1\times10^{21}$ cm$^{-3}$.

The second n-type layer 121b has a function of supplying electrons to the second active layer 122. The second n-type layer 121b includes, for example, GaN doped with Si as the n-type impurity. The second n-type layer 121b may further include In, Al, etc. The second n-type layer 121b may further include one or more undoped semiconductor layers. The undoped semiconductor layer of the second n-type layer 121b includes, for example, GaN. The second active layer 122 is located on the second n-side semiconductor layer 121.

The second active layer 122 includes a second well layer 122a and a second barrier layer 122b alternately arranged in the stacking direction, i.e., the Z-direction as shown in FIG. 2B. According to the embodiment, similarly to the first active layer 113, the second active layer 122 includes seven second well layers 122a and seven second barrier layers 122b. However, the quantity of the second well layers and the quantity of the second barrier layers are not limited to such numbers. The second active layer 122 further includes a fourth barrier layer 122c between the second n-side semiconductor layer 121 and the lowermost second well layer 122a among the multiple second well layers 122a. Thus, the second active layer 122 of the embodiment has a multi-quantum well structure including the multiple second well layers 122a.

Each second well layer 122a is, for example, an undoped semiconductor layer including indium gallium nitride (InGaN). However, at least a portion of the second well layer may include an n-type impurity and/or a p-type impurity. The second well layer 122a may further include Al. The second well layer 122a may be, for example, aluminum gallium nitride (AlGaN).

Each second barrier layer 122b is, for example, an undoped semiconductor layer including GaN. However, at least a portion of the second barrier layer may include an n-type impurity and/or a p-type impurity. The second barrier layer 122b may further include Al.

The fourth barrier layer 122c has, for example, a stacked structure of an undoped semiconductor layer and a semiconductor layer including an n-type impurity. The undoped semiconductor layer of the fourth barrier layer 122c includes, for example, GaN. The semiconductor layer of the fourth barrier layer 122c that includes the n-type impurity includes, for example, InGaN doped with Si as the n-type impurity. The fourth barrier layer 122c has a function of supplying electrons to the second active layer 122.

The thickness t1a of the first well layer 113a, the thickness t1b of the first barrier layer 113b, a thickness t2a of the second well layer 122a, and a thickness t2b of the second barrier layer 122b will now be described.

According to the embodiment, the thickness t1a is substantially the same between the multiple first well layers 113a, the thickness t1b is substantially the same between the multiple first barrier layers 113b, the thickness t2a is substantially the same between the multiple second well layers 122a, and the thickness t2b is substantially the same between the multiple second barrier layers 122b.

The thickness t2a of the second well layer 122a is less than the thickness t1a of the first well layer 113a. The difference between the thickness t1a of the first well layer 113a and the thickness t2a of the second well layer 122a is not particularly limited. It is favorable for the difference between the thickness t1a of the first well layer 113a and the thickness t2a of the second well layer 122a to be, for example, not less than 0.1 nm and not more than 0.5 nm. However, the difference between the thickness t1a of the first well layer 113a and the thickness t2a of the second well layer 122a is not limited to such a range.

The thickness t2b of the second barrier layer 122b is greater than the thickness t1b of the first barrier layer 113b. It is favorable for the difference between the thickness t1b of the first barrier layer 113b and the thickness t2b of the second barrier layer 122b to be not less than 0.1 nm and not more than 0.7 nm. However, the difference between the thickness t1b of the first barrier layer 113b and the thickness t2b of the second barrier layer 122b is not limited to such a range.

The thickness t1b of the first barrier layer 113b is greater than the thickness t1a of the first well layer 113a. The thickness t2b of the second barrier layer 122b is greater than the thickness t2a of the second well layer 122a.

Thus, according to the embodiment, thickness t2b>thickness t1b>thickness t1a>thickness t2a. However, the magnitude relationship of these thicknesses t1a, t1b, t2a, and t2b is not limited to such a magnitude relationship as long as thickness t1a>thickness t2a, and thickness t2b>thickness t1b. For example, the thickness of the first well layer may be not less than the thickness of the first barrier layer.

The difference between the thickness t1a of the first well layer 113a and the thickness t2a of the second well layer 122a is less than the difference between the thickness t1b of the first barrier layer 113b and the thickness t2b of the second barrier layer 122b. In other words, (thickness t1a−thickness t2a)<(thickness t2b−thickness t1b).

A total thickness t2 of one second well layer 122a and one second barrier layer 122b is greater than a total thickness t1 of one first well layer 113a and one first barrier layer 113b. Here, total thickness t2=thickness t2a+thickness t2b, and total thickness t1=thickness t1a+thickness t1b.

The thickness t1a of the first well layer 113a is, for example, not less than 2 nm and not more than 5 nm. The thickness t1*b* of the first barrier layer 113*b* is, for example, not less than 2 nm and not more than 6 nm. However, the thickness t1*a* of the first well layer 113*a* and the thickness t1*b* of the first barrier layer 113*b* are not limited to such ranges.

The thickness t2*a* of the second well layer 122*a* is, for example, not less than 2 nm and not more than 5 nm. The thickness t2*b* of the second barrier layer 122*b* is, for example, not less than 2 nm and not more than 6 nm. The thickness t2*a* of the second well layer 122*a* and the thickness t2*b* of the second barrier layer 122*b* are not limited to such ranges.

The second p-side semiconductor layer 123 is located on the second active layer 122. The second p-side semiconductor layer 123 includes, for example, one or more p-type semiconductor layers. The p-type semiconductor layer of the second p-side semiconductor layer 123 includes, for example, GaN doped with Mg as the p-type impurity. The p-type semiconductor layer of the second p-side semiconductor layer 123 may further include Al.

It is sufficient for the second p-side semiconductor layer 123 to have a function of supplying holes to the second active layer 122, and the second p-side semiconductor layer 123 may further include one or more undoped semiconductor layers. The undoped semiconductor layer of the second p-side semiconductor layer 123 includes, for example, GaN. The undoped semiconductor layer of the second p-side semiconductor layer 123 may further include Al.

As shown in FIG. 1, the n-side electrode 13 is located on the first surface 112*s*1 of the first n-side semiconductor layer 112. The n-side electrode 13 is electrically connected to the first n-side semiconductor layer 112. The p-side electrode 14 is located on the second p-side semiconductor layer 123. The p-side electrode 14 is electrically connected to the second p-side semiconductor layer 123. The first active layer 113 and the second active layer 122 are caused to emit light by applying a forward voltage $V_f$ between the n-side electrode 13 and the p-side electrode 14.

The light that is emitted by the first and second active layers 113 and 122 is, for example, ultraviolet light or visible light. The light emission peak wavelength of the first active layer 113 and the light emission peak wavelength of the second active layer 122 can be the same. For example, the first active layer 113 and the second active layer 122 may emit blue light. The light emission peak wavelength of the first active layer 113 and the light emission peak wavelength of the second active layer 122 may be different. For example, the first active layer 113 may emit blue light, and the second active layer 122 may emit green light. The light emission peak wavelength of the blue light is, for example, not less than 430 nm and not more than 490 nm. The light emission peak wavelength of the green light is, for example, not less than 500 nm and not more than 540 nm.

A reverse bias is applied between the second n-side semiconductor layer 121 and the first p-side semiconductor layer 114 when the forward voltage $V_f$ is applied between the n-side electrode 13 and the p-side electrode 14, that is, when a positive potential is applied to the p-side electrode 14, and a potential that is less than that of the p-side electrode 14 is applied to the n-side electrode 13. Therefore, a tunnel effect due to the tunnel junction of the second n-side semiconductor layer 121 with the first p-side semiconductor layer 114 is utilized to cause a current to flow between the second n-side semiconductor layer 121 and the first p-side semiconductor layer 114. Specifically, the current flows between the second n-side semiconductor layer 121 and the first p-side semiconductor layer 114 by electrons of the valence band of the first p-side semiconductor layer 114 tunneling to the conduction band of the second n-side semiconductor layer 121. In other words, the second n-side semiconductor layer 121 has a tunnel junction with the first p-side semiconductor layer 114 if a current flows between the second n-side semiconductor layer 121 and the first p-side semiconductor layer 114 when the forward voltage $V_f$ is applied to the light-emitting element 10.

By increasing the impurity concentrations of each conductivity type included in the p-type semiconductor layer and the n-type semiconductor layer (according to the embodiment, the first n-type layer 121*a*) forming the p-n junction of the first p-side semiconductor layer 114 and the second n-side semiconductor layer 121, the width of the depletion layer formed by the p-n junction can be reduced. When the voltage is applied, the electrons of the valence band of the first p-side semiconductor layer 114 tunnel into the conduction band of the second n-side semiconductor layer 121 more easily as the width of the depletion layer decreases.

A method for manufacturing the light-emitting element 10 will now be described.

Figure 4:
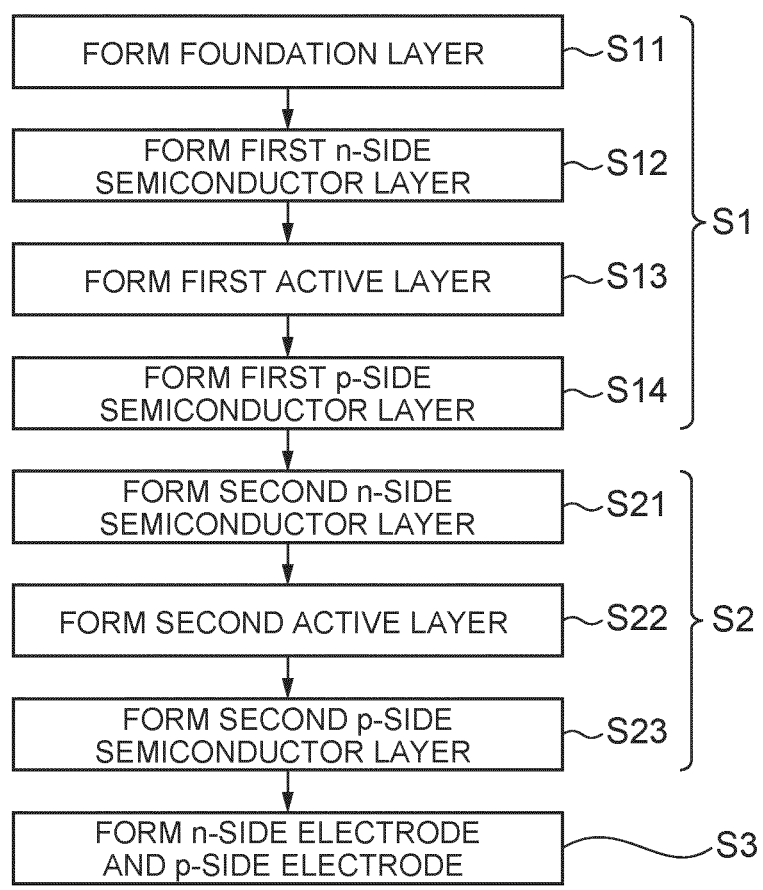
FIG. 4 is a flowchart showing a method for manufacturing the light-emitting element according to the first embodiment.

FIG. 4 is a flowchart showing the method for manufacturing the light-emitting element 10 according to the embodiment.

Figure 5A:
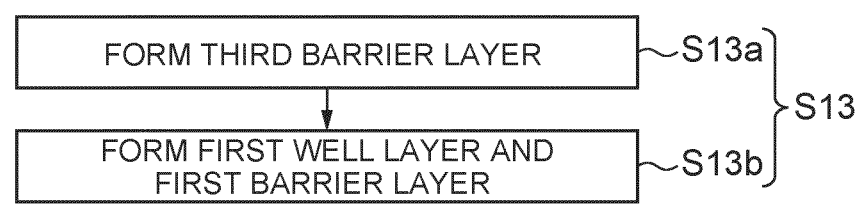
FIG. 5A is a flowchart showing details of a process of forming the first active layer of FIG. 4.

FIG. 5A is a flowchart showing details of a process S13 of forming the first active layer 113 of FIG. 4.

Figure 5B:
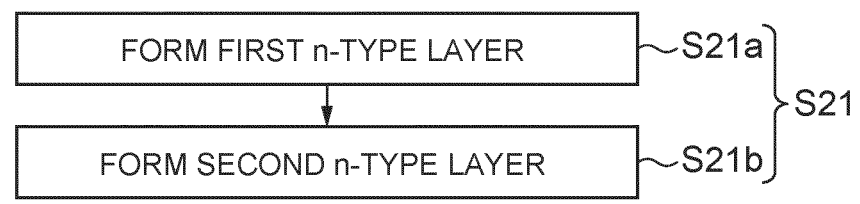
FIG. 5B is a flowchart showing details of a process of forming the second n-side semiconductor layer of FIG. 4.

FIG. 5B is a flowchart showing details of a process S21 of forming the second n-side semiconductor layer 121 of FIG. 4.

Figure 5C:
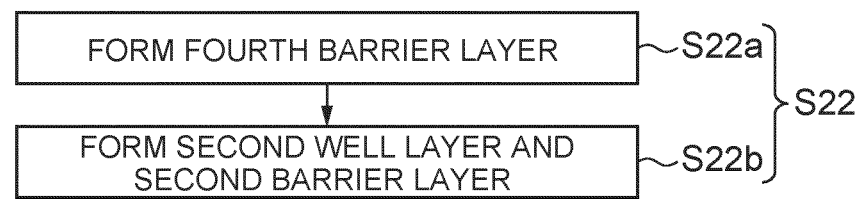
FIG. 5C is a flowchart showing details of a process of forming the second active layer of FIG. 4.

FIG. 5C is a flowchart showing details of a process S22 of forming the second active layer 122 of FIG. 4.

Figure 6:
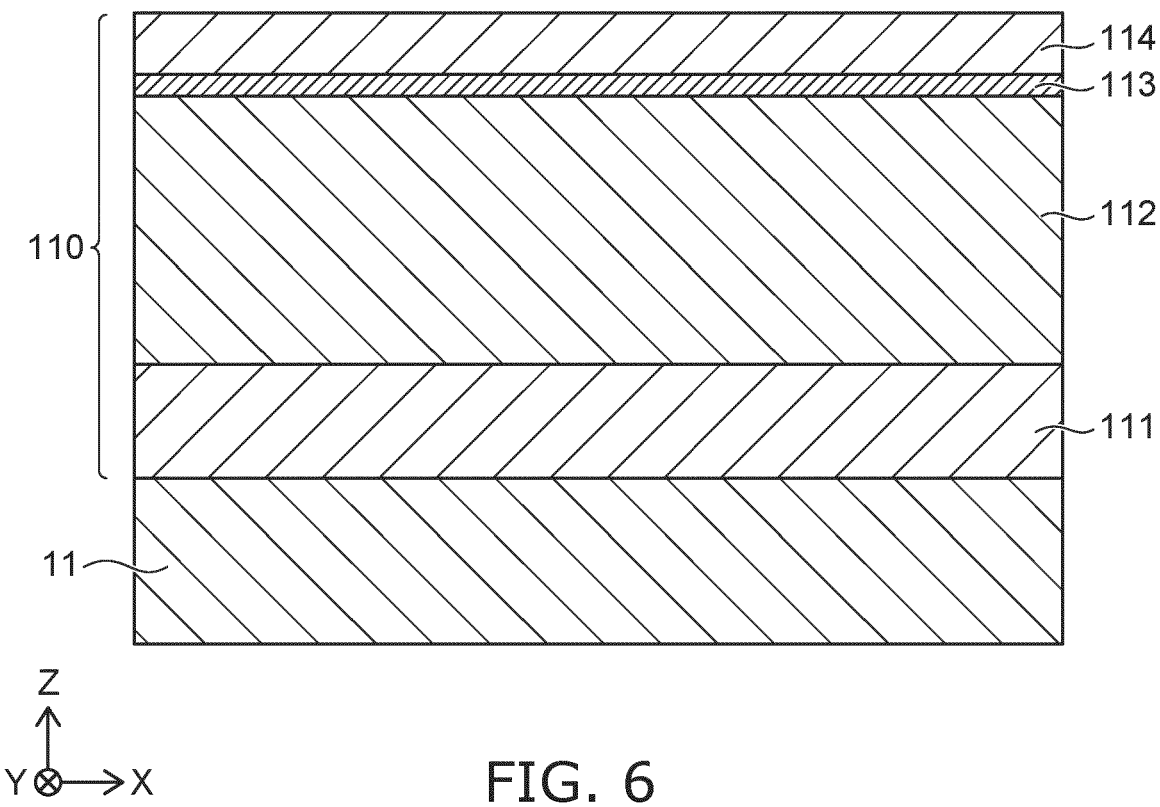
FIG. 6 is a cross-sectional view illustrating manufacturing processes of the nitride semiconductor light-emitting element according to the first embodiment.

FIG. 6 is a cross-sectional view illustrating manufacturing processes of the nitride semiconductor light-emitting element 10 according to the embodiment.

Figure 7:
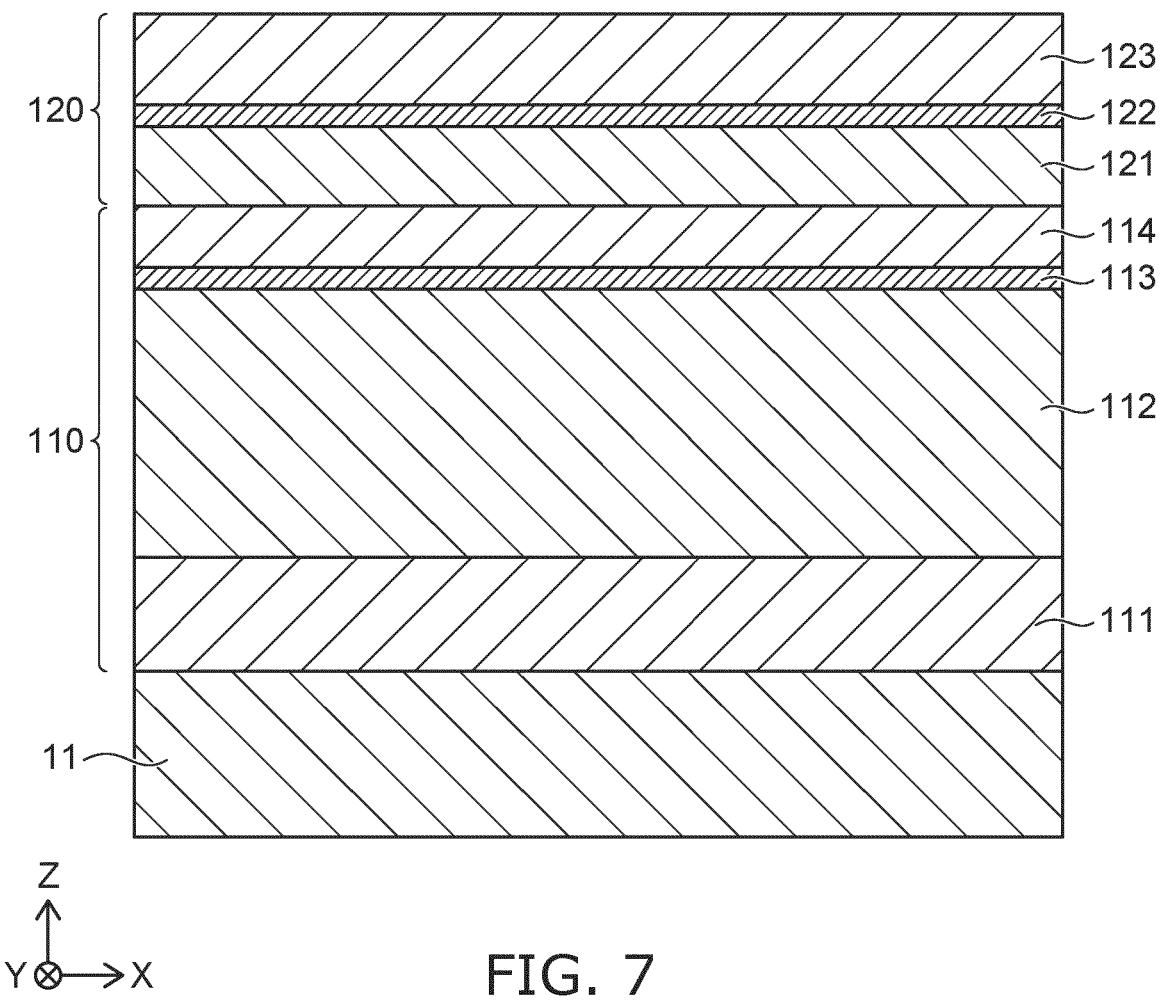
FIG. 7 is a cross-sectional view illustrating manufacturing processes of the nitride semiconductor light-emitting element according to the first embodiment.

FIG. 7 is a cross-sectional view illustrating manufacturing processes of the nitride semiconductor light-emitting element 10 according to the embodiment.

As shown in FIG. 4, the method for manufacturing the light-emitting element 10 includes a process S1 of forming the first light-emitting part 110, a process S2 of forming the second light-emitting part 120, and a process S3 of forming the n-side electrode 13 and the p-side electrode 14.

For example, the first light-emitting part 110 and the second light-emitting part 120 that are included in the semiconductor structure body 12 are formed by MOCVD (metal organic chemical vapor deposition) in a furnace in which the pressure and the temperature can be adjusted. Specifically, the semiconductor structure body 12 is formed on the substrate 11 by supplying a carrier gas and a raw material gas to the furnace.

For example, hydrogen ($H_2$) gas, nitrogen ($N_2$) gas, etc., can be used as the carrier gas.

The raw material gas is appropriately selected according to the semiconductor layer to be formed. When a semiconductor layer that includes Ga is formed, for example, a raw material gas that includes Ga such as trimethylgallium (TMG) gas, triethylgallium (TEG) gas, or the like is used. When forming a semiconductor layer that includes N, for example, a raw material gas that includes N such as ammonia ($NH_3$) gas or the like is used. When forming a semiconductor layer that includes Al, for example, a raw material gas that includes Al such as trimethylaluminum (TMA) gas or the like is used. When forming a semiconductor layer that includes In, for example, a raw material gas that includes In such as trimethylindium (TMI) or the like is used. When forming a semiconductor layer that includes Si, for example, a gas that includes Si such as monosilane (SiH₄) gas or the like is used. When forming a semiconductor layer that includes Mg, for example, a raw material gas that includes Mg such as bis cyclopentadienyl magnesium (Cp₂Mg) gas or the like is used. Hereinbelow, the supply of a raw material gas that includes one element and a raw material gas that includes another element to the furnace also is called simply "supplying a raw material gas that includes one element and another element." The processes will now be elaborated.

First, the process S1 of forming the first light-emitting part 110 is performed.

The process S1 of forming the first light-emitting part 110 includes a process S11 of forming the foundation layer 111, a process S12 of forming the first n-side semiconductor layer 112, the process S13 of forming the first active layer 113, and a process S14 of forming the first p-side semiconductor layer 114.

In the process S11 of forming the foundation layer 111, a carrier gas and a raw material gas that correspond to the foundation layer 111 are supplied to the furnace. Thereby, the foundation layer 111 is formed on the substrate 11.

In the process S12 of forming the first n-side semiconductor layer 112, a carrier gas and a raw material gas that correspond to the first n-side semiconductor layer 112 are supplied to the furnace. Thereby, the first n-side semiconductor layer 112 is formed on the foundation layer 111.

As shown in FIG. 5A, the process S13 of forming the first active layer 113 includes a process S13a of forming the third barrier layer 113c and a process S13b of forming the first well layer 113a and the first barrier layer 113b.

In the process S13a of forming the third barrier layer 113c, for example, an undoped semiconductor layer and an n-type semiconductor layer are formed on the first n-side semiconductor layer 112. For example, the undoped semiconductor layer is formed by supplying a carrier gas and a raw material gas that includes Ga and N to the furnace. At this time, a raw material gas that includes an n-type impurity or a p-type impurity is not supplied. For example, the n-type semiconductor layer is formed by supplying a carrier gas, a raw material gas that includes In, Ga, and N, and a raw material gas that includes Si as an n-type impurity to the furnace.

In the process S13b of forming the first well layer 113a and the first barrier layer 113b, first, a carrier gas and a raw material gas that includes In, Ga, and N are supplied to the furnace. At this time, a raw material gas that includes an n-type impurity or a p-type impurity is not supplied. Thereby, the first well layer 113a that is an undoped InGaN layer is formed on the third barrier layer 113c. Then, a carrier gas and a raw material gas that includes Ga and N are supplied to the furnace. At this time, a raw material gas that includes an n-type impurity or a p-type impurity is not supplied. Thereby, the first barrier layer 113b that is an undoped GaN layer is formed on the first well layer 113a. According to the embodiment, the formation of the first well layer 113a and the formation of the first barrier layer 113b are alternately performed multiple times. Thereby, a stacked body that includes the first well layer 113a and the first barrier layer 113b alternately arranged in the stacking direction, i.e., the Z-direction, is formed on the first n-side semiconductor layer 112.

According to the embodiment, the first well layer 113a and the first barrier layer 113b are formed so that the thickness t1b of the first barrier layer 113b is greater than the thickness t1a of the first well layer 113a.

In the process S14 of forming the first p-side semiconductor layer 114, a carrier gas and a raw material gas that correspond to the first p-side semiconductor layer 114 are supplied to the furnace. Thereby, the first p-side semiconductor layer 114 is formed on the first active layer 113, that is, on the uppermost first barrier layer 113b.

Thus, as shown in FIG. 6, the first light-emitting part 110 that includes the foundation layer 111, the first n-side semiconductor layer 112, the first active layer 113, and the first p-side semiconductor layer 114 is formed on the substrate 11.

Then, the process S2 of forming the second light-emitting part 120 is performed.

As shown in FIG. 4, the process S2 of forming the second light-emitting part 120 includes the process S21 of forming the second n-side semiconductor layer 121, the process S22 of forming the second active layer 122, and a process S23 of forming the second p-side semiconductor layer 123.

According to the embodiment as shown in FIG. 5B, the process S21 of forming the second n-side semiconductor layer 121 includes a process S21a of forming the first n-type layer 121a and a process S21b of forming the second n-type layer 121b.

In the process S21a of forming the first n-type layer 121a, for example, a carrier gas, a raw material gas that includes Ga and N, and a raw material gas that includes Si as an n-type impurity are supplied to the furnace. Thereby, the first n-type layer 121a is formed on the first light-emitting part 110. The first n-type layer 121a may be formed by MBE (Molecular Beam Epitaxy) instead of MOCVD.

In the process S21b of forming the second n-type layer 121b, a carrier gas and a raw material gas that correspond to the second n-type layer 121b are supplied to the furnace. Thereby, the second n-type layer 121b is formed on the first n-type layer 121a.

As shown in FIG. 5C, the process S22 of forming the second active layer 122 includes a process S22a of forming the fourth barrier layer 122c and a process S22b of forming the second well layer 122a and the second barrier layer 122b.

In the process S22a of forming the fourth barrier layer 122c, for example, an undoped semiconductor layer and an n-type semiconductor layer are formed on the second n-side semiconductor layer 121. For example, the undoped semiconductor layer is formed by supplying a carrier gas and a raw material gas that includes Ga and N to the furnace. At this time, a raw material gas that includes an n-type impurity or a p-type impurity is not supplied. For example, the n-type semiconductor layer is formed by supplying a carrier gas, a raw material gas that includes In, Ga, and N, and a raw material gas that includes Si as an n-type impurity to the furnace.

In the process S22b of forming the second well layer 122a and the second barrier layer 122b, first, a carrier gas and a raw material gas that includes In, Ga, and N are supplied to the furnace. At this time, a raw material gas that includes an n-type impurity or a p-type impurity is not supplied. Thereby, the second well layer 122a that is an undoped InGaN layer is formed on the fourth barrier layer 122c. Then, a carrier gas and a raw material gas that includes Ga and N are supplied to the furnace. At this time, a raw material gas that includes an n-type impurity or a p-type impurity is not supplied. Thereby, the second barrier layer 122b that is an undoped GaN layer is formed on the second well layer 122a. According to the embodiment, the formation of the second well layer 122a and the formation of the second barrier layer 122b are alternately performed multiple times. Thereby, a stacked body that includes the second well layer 122a and the second barrier layer 122b alternately arranged in the Z-direction is formed on the second n-side semiconductor layer 121.

According to the embodiment, the second well layer 122a is formed so that the thickness t2a of the second well layer 122a is less than the thickness t1a of the first well layer 113a. Also, the second barrier layer 122b is formed so that the thickness t2b of the second barrier layer 122b is greater than the thickness t1b of the first barrier layer 113b.

In the process S23 of forming the second p-side semiconductor layer 123, a carrier gas and a raw material gas that correspond to the second p-side semiconductor layer 123 are supplied to the furnace. Thereby, the second p-side semiconductor layer 123 is formed on the second active layer 122, that is, on the uppermost second barrier layer 122b.

Thus, as shown in FIG. 7, the second light-emitting part 120 that includes the second n-side semiconductor layer 121, the second active layer 122, and the second p-side semiconductor layer 123 is formed on the first light-emitting part 110.

Then, the process S3 of forming the n-side electrode 13 and the p-side electrode 14 is performed.

In the process S3 of forming the n-side electrode 13 and the p-side electrode 14, first, the first and third surfaces 112s1 and 112s3 of the first n-side semiconductor layer 112 are exposed at the first active layer 113, the first p-side semiconductor layer 114, and the second light-emitting part 120 by removing a portion of the semiconductor structure body 12 as shown in FIG. 1. For example, the portion of the semiconductor structure body 12 can be removed by selectively etching by using a resist.

Then, the n-side electrode 13 is formed on the exposed first surface 112s1. The p-side electrode 14 is formed on the second p-side semiconductor layer 123. For example, the n-side electrode 13 and the p-side electrode 14 can be formed by sputtering or vapor deposition.

Thus, the light-emitting element 10 can be obtained. However, the method for manufacturing the light-emitting element 10 is not limited to the method described above. For example, the method for manufacturing the light-emitting element 10 may not include the process S11 of forming the foundation layer 111, and the first n-side semiconductor layer 112 may be directly formed on the substrate 11.

Effects of the embodiment will now be described.

The nitride semiconductor light-emitting element 10 according to the embodiment includes the first n-side semiconductor layer 112, the first active layer 113 located on the first n-side semiconductor layer 112, the first p-side semiconductor layer 114 located on the first active layer 113, the second n-side semiconductor layer 121 that is located on the first p-side semiconductor layer 114 and has a tunnel junction with the first p-side semiconductor layer 114, the second active layer 122 located on the second n-side semiconductor layer 121, and the second p-side semiconductor layer 123 located on the second active layer 122. The first active layer 113 includes the first well layer 113a and the first barrier layer 113b alternately arranged in the stacking direction that is from the first n-side semiconductor layer 112 toward the first p-side semiconductor layer 114. The second active layer 122 includes the second well layer 122a and the second barrier layer 122b alternately arranged in the stacking direction. The thickness t2a of the second well layer 122a is less than the thickness t1a of the first well layer 113a. The thickness t2b of the second barrier layer 122b is greater than the thickness t1b of the first barrier layer 113b.

There are cases in which the crystallinity of the second n-side semiconductor layer 121 is degraded by increasing the n-type impurity concentration of the second n-side semiconductor layer 121 to provide the second n-side semiconductor layer 121 with a tunnel junction with the first p-side semiconductor layer 114. When the second n-side semiconductor layer 121 is formed to have degraded crystallinity, there are cases in which the second active layer 122 inherits the crystallinity of the second n-side semiconductor layer 121, and the crystallinity of the second active layer 122 is degraded. In particular, the luminous efficiency of the light-emitting element 10 is easily reduced when the crystallinity of the second well layer 122a that contributes to the light emission is degraded. In contrast, according to the embodiment, the degradation of the crystallinity of the second well layer 122a can be reduced by making the second well layer 122a thin. On the other hand, by making the second barrier layer 122b thick, the crystallinity can be improved, and the crystallinity of the second well layer 122a formed on the second barrier layer 122b can be improved. Thus, the light-emitting element 10 that has high luminous efficiency can be provided.

The difference between the thickness t1a of the first well layer 113a and the thickness t2a of the second well layer 122a is less than the difference between the thickness t1b of the first barrier layer 113b and the thickness t2b of the second barrier layer 122b. Thereby, the second well layer 122a can be thin, and the second barrier layer 122b can be thick; therefore, the crystallinity of the second well layer 122a can be improved. As a result, the luminous efficiency of the light-emitting element 10 can be increased.

The total thickness t2 of one second well layer 122a and one second barrier layer 122b is greater than the total thickness t1 of one first well layer 113a and one first barrier layer 113b. The thickness of the second barrier layer 122b can be increased thereby, which can improve the crystallinity of the second well layer 122a. As a result, the luminous efficiency of the light-emitting element 10 can be increased.

The thickness t2b of the second barrier layer 122b is greater than the thickness t2a of the second well layer 122a. Thereby, the second well layer 122a can be thin, and the second barrier layer 122b can be thick; therefore, the crystallinity of the second well layer 122a can be improved. As a result, the luminous efficiency of the light-emitting element 10 can be increased.

Second Embodiment

A second embodiment will now be described.

Figure 8A:
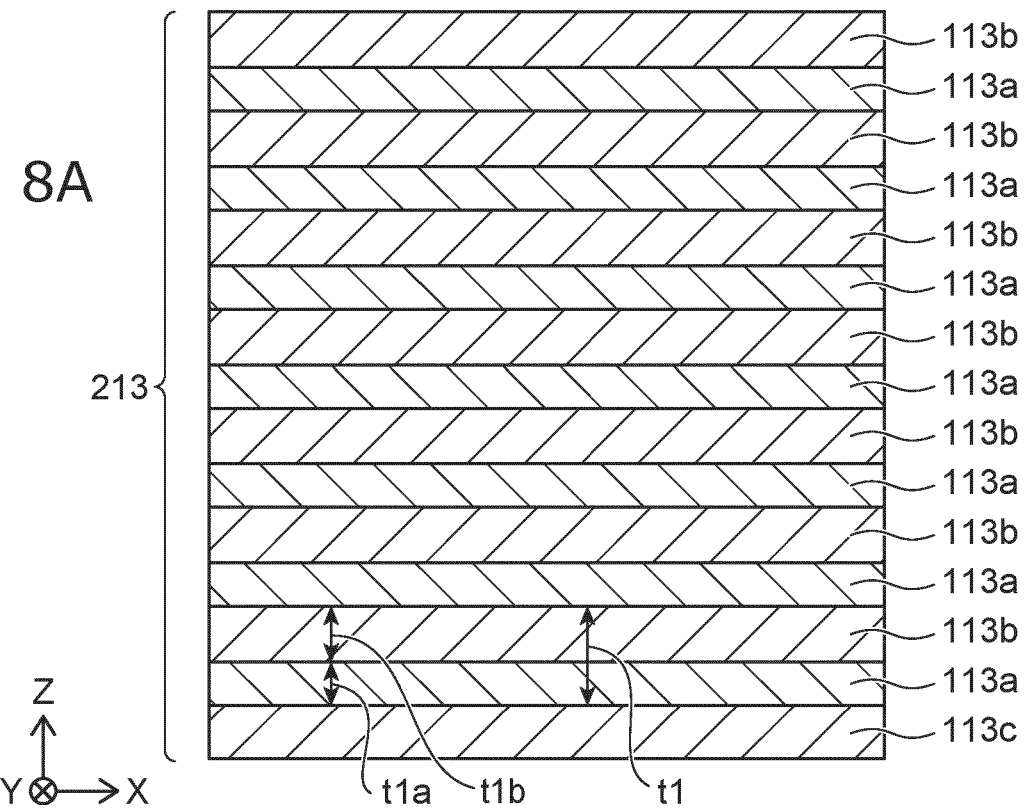
FIG. 8A is an enlarged cross-sectional view showing a first active layer according to a second embodiment.

FIG. 8A is an enlarged cross-sectional view showing a first active layer 213 according to the embodiment.

Figure 8B:
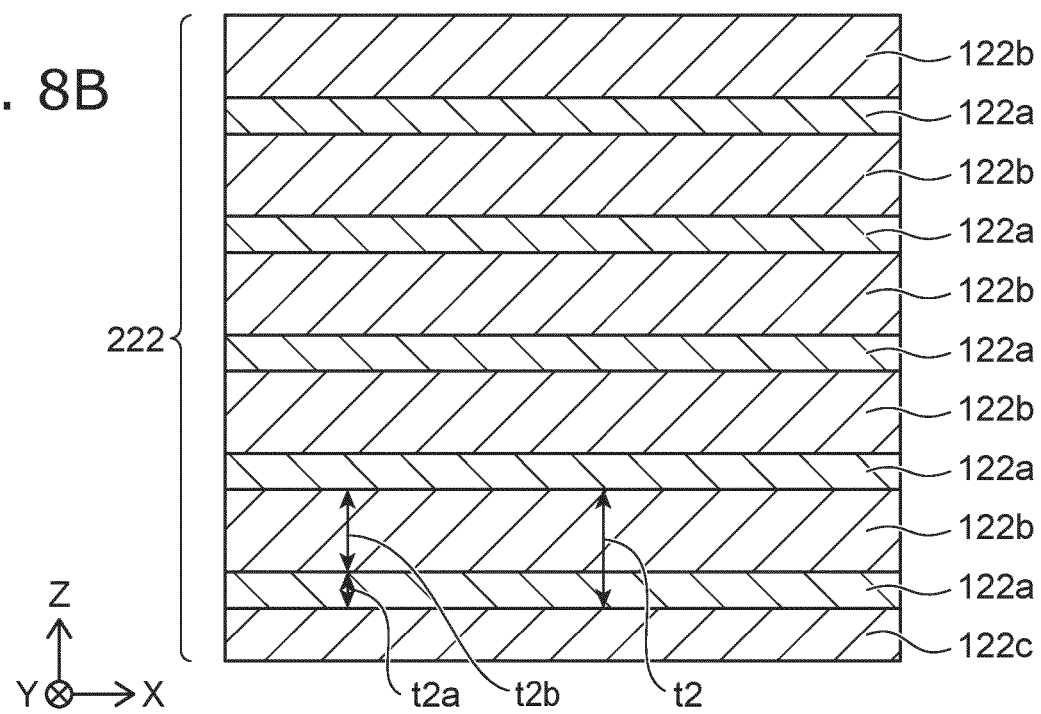
FIG. 8B is an enlarged cross-sectional view showing a second active layer according to the second embodiment.

FIG. 8B is an enlarged cross-sectional view showing a second active layer 222 according to the embodiment.

As a general rule in the following description, differences with the first embodiment are mainly described. Other than the items described below, the configuration can be similar to that of the first embodiment.

According to the embodiment, the quantity of the second well layers 122a provided in the second active layer 222 is less than the quantity of the first well layers 113a provided in the first active layer 213. Thus, the degradation of the crystallinity of the second active layer 222 can be reduced by reducing the quantity of the second well layers 122a for which the crystallinity easily degrades.

EXAMPLES

Examples and reference examples will now be described.

Nitride semiconductor light-emitting elements according to reference examples 1 to 3 and examples 1 to 4 were made. The light-emitting elements according to the reference examples 1 to 3 and the examples 1 to 4 each had a layer structure similar to that of the light-emitting element 10 shown in FIG. 1. The light-emitting elements according to the reference examples 1 to 3 and the examples 1 to 4 were made by forming the first well layer and the first barrier layer of the first active layer and the second well layer and the second barrier layer of the second active layer with the thicknesses shown in the table below; otherwise, a common method for forming the layers was used. In the table below, t1a=3.5 nm, and t1b=3.6 nm. The method for manufacturing the light-emitting elements will now be elaborated.

TABLE 1

| | First well layer thickness | First barrier layer thickness | Second well layer thickness | Second barrier layer thickness |
|---|---|---|---|---|
| Reference example 1 | t1a | t1b | t1a | t1b |
| Reference example 2 | t1a | t1b | t1a − 0.2 nm | t1b |
| Example 1 | t1a | t1b | t1a − 0.2 nm | t1b + 0.2 nm |
| Example 2 | t1a | t1b | t1a − 0.2 nm | t1b + 0.4 nm |
| Reference example 3 | t1a | t1b | t1a − 0.4 nm | t1b |
| Example 3 | t1a | t1b | t1a − 0.4 nm | t1b + 0.4 nm |
| Example 4 | t1a | t1b | t1a − 0.4 nm | t1b + 0.6 nm |

First, a foundation layer that included an undoped GaN layer and had a thickness of about 5 μm was formed on a substrate made of sapphire.

Then, the first n-side semiconductor layer that included a GaN layer doped with Si and an undoped GaN layer and had a thickness of about 5.5 μm was formed on the foundation layer.

Continuing, the first active layer that included the third barrier layer, seven first well layers, and seven first barrier layers and had a thickness of about 50 nm was formed on the first n-side semiconductor layer. The third barrier layer included an undoped GaN layer and an InGaN layer doped with Si. The first well layer was an undoped InGaN layer. The first barrier layer was an undoped GaN layer. The first well layer and the first barrier layer were alternately formed. The thickness t1b of the first barrier layer was made 0.1 nm greater than the thickness t1a of the first well layer.

Then, the first p-side semiconductor layer that included a GaN layer doped with Mg and had a thickness of about 85 nm was formed on the first active layer.

Continuing, the second n-side semiconductor layer that included the first and second n-type layers was formed on the first p-side semiconductor layer. The first n-type layer included a GaN layer doped with Si and had a thickness of about 2 nm. The second n-type layer included a GaN layer doped with Si and had a thickness of about 200 nm.

Then, the second active layer that included the fourth barrier layer, seven second well layers, and seven second barrier layers was formed on the second n-side semiconductor layer. The fourth barrier layer was an undoped GaN layer and an InGaN layer doped with Si. The second well layer was an undoped InGaN layer. The second barrier layer was an undoped GaN layer. The second well layer and the second barrier layer were alternately formed.

In the reference example 1, the thickness of the second well layer was substantially equal to the thickness t1a of the first well layer, and the thickness of the second barrier layer was substantially equal to the thickness t1b of the first barrier layer. In the reference example 2, the thickness of the second well layer was about 0.2 nm less than the thickness t1a of the first well layer, and the thickness of the second barrier layer was substantially equal to the thickness t1b of the first barrier layer.

In the example 1, the thickness of the second well layer was about 0.2 nm less than the thickness t1a of the first well layer, and the thickness of the second barrier layer was about 0.2 nm greater than the thickness t1b of the first barrier layer. In the example 2, the thickness of the second well layer was about 0.2 nm less than the thickness t1a of the first well layer, and the thickness of the second barrier layer was about 0.4 nm greater than the thickness t1b of the first barrier layer.

In the reference example 3, the thickness of the second well layer was about 0.4 nm less than the thickness t1a of the first well layer, and the thickness of the second barrier layer was substantially the same thickness as the thickness t1b of the first barrier layer.

In the example 3, the thickness of the second well layer was about 0.4 nm less than the thickness t1a of the first well layer, and the thickness of the second barrier layer was about 0.4 nm greater than the thickness t1b of the first barrier layer. In the example 4, the thickness of the second well layer was about 0.4 nm less than the thickness t1a of the first well layer, and the thickness of the second barrier layer was about 0.6 nm greater than the thickness t1b of the first barrier layer.

Then, the second p-side semiconductor layer that included a GaN layer doped with Mg and had a thickness of about 115 nm was formed on the second active layer.

Continuing, portions of the first n-side semiconductor layer, the first active layer, the first p-side semiconductor layer, the second n-side semiconductor layer, the second active layer, and the second p-side semiconductor layer were removed, the n-side electrode was formed on the exposed first n-side semiconductor layer, and the p-side electrode was formed on the second p-side semiconductor layer.

Figure 9A:
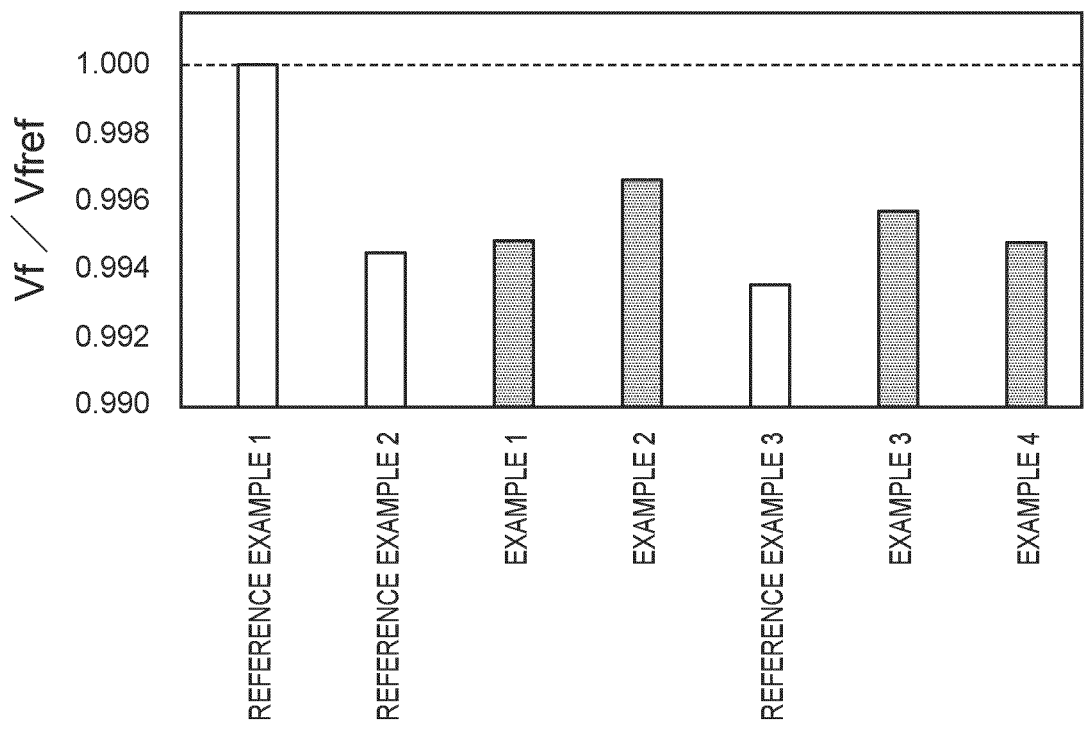
FIG. 9A is a graph showing values $V_f/V_{fref}$ of normalized forward voltages $V_f$ of nitride semiconductor light-emitting elements according to reference examples 1 to 3 and examples 1 to 4.

FIG. 9A is a graph showing values $V_f/V_{fref}$ of the normalized forward voltages $V_f$ of the nitride semiconductor light-emitting elements according to the reference examples 1 to 3 and the examples 1 to 4.

Figure 9B:
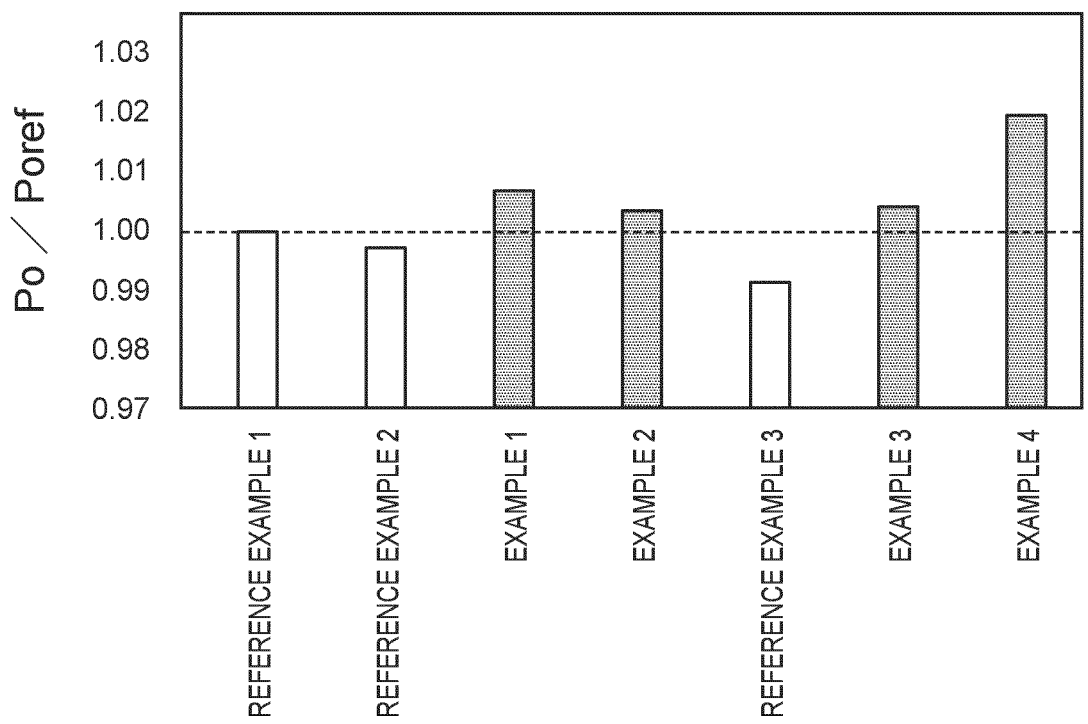
FIG. 9B is a graph showing values $P_o/P_{oref}$ of normalized outputs $P_o$ of the nitride semiconductor light-emitting elements according to the reference examples 1 to 3 and the examples 1 to 4.

FIG. 9B is a graph showing values $P_o/P_{oref}$ of the normalized outputs $P_o$ of the nitride semiconductor light-emitting elements according to the reference examples 1 to 3 and the examples 1 to 4.

Figure 10:
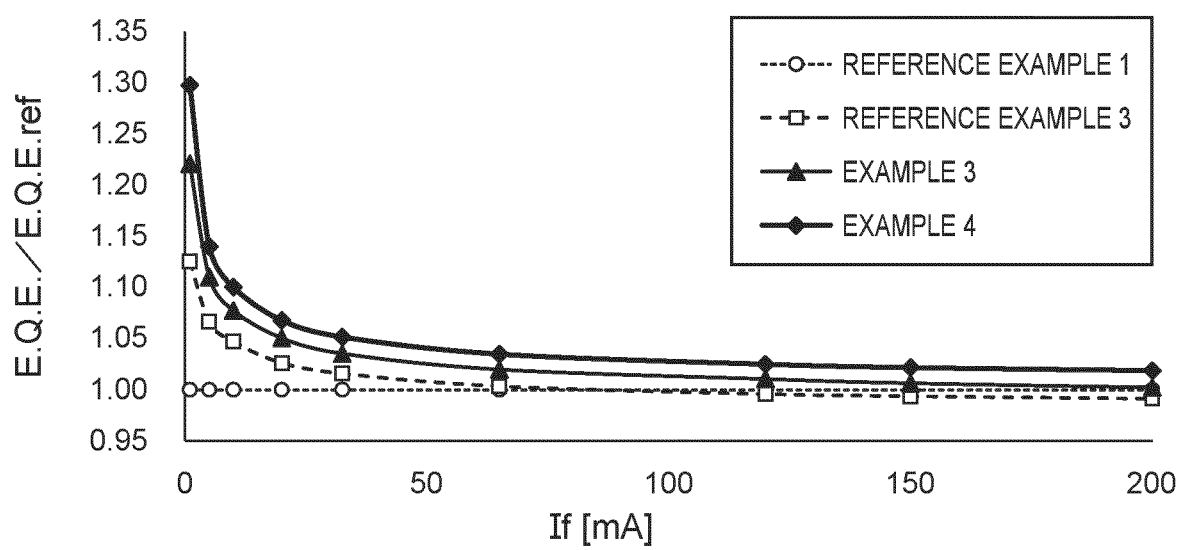
FIG. 10 is a graph showing a relationship between forward currents If of the light-emitting elements and values E.Q.E./E.Q.E.$_{ref}$ of normalized external quantum efficiencies E.Q.E. of the reference examples 1 and 3 and the examples 3 and 4.

FIG. 10 is a graph showing the relationship between forward currents If of the light-emitting elements and values E.Q.E./E.Q.E.$_{ref}$ of the normalized external quantum efficiencies E.Q.E. of the reference examples 1 and 3 and the examples 3 and 4.

The forward voltages $V_f$ of the light-emitting elements of the reference examples 1 to 3 and according to the examples 1 to 4 that were made each were measured. The results are shown in FIG. 9A. The vertical axis of FIG. 9A shows values normalized by using the forward voltage $V_f$ of the reference example 1 as a reference forward voltage $V_{fref}$, and by dividing the measured forward voltages $V_f$ by the reference forward voltage $V_{fref}$.

The outputs $P_o$ of the light-emitting elements according to the reference examples 1 to 3 and the examples 1 to 4 that were made each were measured. The results are shown in FIG. 9B. The vertical axis of FIG. 9B shows values normalized by using the output $P_o$ of the reference example 1 as a reference output $P_{oref}$, and by dividing the measured outputs $P_o$ by the reference output $P_{oref}$.

The external quantum efficiencies E.Q.E. were measured when the forward currents If of the light-emitting elements according to the reference examples 1 and 3 and the examples 3 and 4 that were made were changed between 0 mA and 200 mA. The results are shown in FIG. 10. The vertical axis of FIG. 10 shows values normalized by using the maximum value of the external quantum efficiency E.Q.E. of the reference example 1 as a reference external quantum efficiency E.Q.E.$_{ref}$, and by dividing the measured external quantum efficiencies E.Q.E. by the reference external quantum efficiency E.Q.E.$_{ref}$.

The light-emitting elements according to the reference examples 2 and 3 differed from the light-emitting elements according to the reference example 1 in that the thickness of the second well layer was less than the thickness of the first well layer. As shown in FIG. 9A, the forward voltages $V_f$ of the light-emitting elements according to the reference examples 2 and 3 were less than the forward voltage $V_f$ of the light-emitting element according to the reference example 1. It is considered that this is because the degradation of the crystallinity of the second well layer was reduced by setting the thickness of the second well layer to be less than the thickness of the first well layer. On the other hand, as shown in FIG. 9B, the outputs $P_o$ of the light-emitting elements according to the reference examples 2 and 3 were less than the output $P_o$ of the light-emitting element according to the reference example 1. Thus, it was found that the forward voltage $V_f$ can be reduced by only reducing the thickness of the second well layer, but the output $P_o$ is reduced.

The light-emitting elements according to the examples 1 and 2 differed from the light-emitting element according to the reference example 2 in that the thickness of the second barrier layer was greater than the thickness of the first barrier layer. As shown in FIG. 9A, the forward voltages $V_f$ of the light-emitting elements according to the examples 1 and 2 were greater than the forward voltage $V_f$ of the light-emitting element according to the reference example 2 but less than the forward voltage $V_f$ of the light-emitting element according to the reference example 1. As shown in FIG. 9B, the outputs $P_o$ of the light-emitting elements according to the examples 1 and 2 were greater than the outputs $P_o$ of the light-emitting elements according to the reference examples 1 and 2. Similarly, the light-emitting elements according to the examples 3 and 4 differed from the light-emitting element according to the reference example 3 in that the thickness of the second barrier layer was greater than the thickness of the first barrier layer. As shown in FIG. 9A, the forward voltages $V_f$ of the light-emitting elements according to the examples 3 and 4 were greater than the forward voltage $V_f$ of the light-emitting element according to the reference example 3 but less than the forward voltage $V_f$ of the light-emitting element according to the reference example 1. As shown in FIG. 9B, the outputs $P_o$ of the light-emitting elements according to the examples 3 and 4 were greater than the outputs $P_o$ of the light-emitting elements according to the reference examples 1 and 3. Thus, it was found that the output $P_o$ of the light-emitting element according to the reference example 1 can be further increased by setting the thickness of the second barrier layer to be greater than the thickness of the first barrier layer even when the thickness of the second well layer is reduced.

The output $P_o$ of the light-emitting element according to the example 4 was greater than the output $P_o$ of the light-emitting element according to the example 3. The light-emitting element according to the example 4 differed from the light-emitting element according to the example 3 in that the difference (0.4 nm) between the thickness of the first well layer and the thickness of the second well layer was less than the difference (0.6 nm) between the thickness of the first barrier layer and the thickness of the second well layer and in that the total thickness of one second well layer and one second barrier layer was greater than the total thickness of one first well layer and one first barrier layer. Accordingly, it is favorable for the difference between the thickness of the first well layer and the thickness of the second well layer to be less than the difference between the thickness of the first barrier layer and the thickness of the second well layer. Also, it is favorable for the total thickness of one second well layer and one second barrier layer to be greater than the total thickness of one first well layer and one first barrier layer.

As shown in FIG. 10, the external quantum efficiency E.Q.E. of the light-emitting element according to the reference example 3 was greater than the external quantum efficiency E.Q.E. of the light-emitting element according to the reference example 1 when the forward current If was in the range of 200 mA or less. Accordingly, it was found that the external quantum efficiency E.Q.E. can be increased by setting the thickness of the second well layer to be less than the thickness of the first well layer.

The external quantum efficiencies E.Q.E. of the light-emitting elements according to the examples 3 and 4 were greater than the external quantum efficiency E.Q.E. of the light-emitting element according to the reference example 3 when the forward current If was in the range of 200 mA or less. Accordingly, it was found that the external quantum efficiency E.Q.E. can be increased by setting the thickness of the second barrier layer to be greater than the thickness of the first barrier layer.

According to embodiments described above, a nitride semiconductor light-emitting element having high luminous efficiency can be provided.

What is claimed is:

1. A nitride semiconductor light-emitting element, comprising:
    a first n-side semiconductor layer;
    a first active layer located on the first n-side semiconductor layer;
    a first p-side semiconductor layer located on the first active layer;
    a second n-side semiconductor layer located on the first p-side semiconductor layer, the second n-side semiconductor layer having a tunnel junction with the first p-side semiconductor layer;
    a second active layer located on the second n-side semiconductor layer; and
    a second p-side semiconductor layer located on the second active layer; wherein:
    the first active layer comprises a first well layer and a first barrier layer alternately arranged in a stacking direction, the stacking direction being from the first n-side semiconductor layer toward the first p-side semiconductor layer;

the second active layer comprises a second well layer and a second barrier layer alternately arranged in the stacking direction;

a thickness of the second well layer is less than a thickness of the first well layer; and a thickness of the second barrier layer is greater than a thickness of the first barrier layer.

2. The element according to claim 1, wherein:
a difference between the thickness of the first well layer and the thickness of the second well layer is less than a difference between the thickness of the first barrier layer and the thickness of the second barrier layer.

3. The element according to claim 2, wherein:
a total thickness of one of the second well layers and one of the second barrier layers is greater than a total thickness of one of the first well layers and one of the first barrier layers.

4. The element according to claim 2, wherein:
a difference between the thickness of the first well layer and the thickness of the second well layer is not less than 0.1 nm and not more than 0.5 nm.

5. The element according to claim 2, wherein:
a difference between the thickness of the first barrier layer and the thickness of the second barrier layer is not less than 0.1 nm and not more than 0.7 nm.

6. The element according to claim 2, wherein:
a quantity of the second well layers is less than a quantity of the first well layers.

7. The element according to claim 2, wherein:
the thickness of the second barrier layer is greater than the thickness of the second well layer.

8. The element according to claim 2, wherein:
the first barrier layer and the second barrier layer each comprise gallium nitride; and
the first well layer and the second well layer each comprise indium gallium nitride.

9. The element according to claim 1, wherein:
a total thickness of one of the second well layers and one of the second barrier layers is greater than a total thickness of one of the first well layers and one of the first barrier layers.

10. The element according to claim 9, wherein:
a difference between the thickness of the first well layer and the thickness of the second well layer is not less than 0.1 nm and not more than 0.5 nm.

11. The element according to claim 9, wherein:
a quantity of the second well layers is less than a quantity of the first well layers.

12. The element according to claim 9, wherein:
the thickness of the second barrier layer is greater than the thickness of the second well layer.

13. The element according to claim 9, wherein:
the first barrier layer and the second barrier layer each comprise gallium nitride; and
the first well layer and the second well layer each comprise indium gallium nitride.

14. The element according to claim 1, wherein:
a difference between the thickness of the first well layer and the thickness of the second well layer is not less than 0.1 nm and not more than 0.5 nm.

15. The element according to claim 14, wherein:
a difference between the thickness of the first barrier layer and the thickness of the second barrier layer is not less than 0.1 nm and not more than 0.7 nm.

16. The element according to claim 1, wherein:
a difference between the thickness of the first barrier layer and the thickness of the second barrier layer is not less than 0.1 nm and not more than 0.7 nm.

17. The element according to claim 1, wherein:
a quantity of the second well layers is less than a quantity of the first well layers.

18. The element according to claim 1, wherein:
the thickness of the second barrier layer is greater than the thickness of the second well layer.

19. The element according to claim 1, wherein:
the first barrier layer and the second barrier layer each comprise gallium nitride; and
the first well layer and the second well layer each comprise indium gallium nitride.

\* \* \* \* \*